United States Patent
Hong (10) Patent No.: US 9,614,065 B2
(45) Date of Patent: Apr. 4, 2017

(54) INHOMOGENEOUS POWER SEMICONDUCTOR DEVICES

(71) Applicant: Infineon Technologies AG, Neubiberg (DE)

(72) Inventor: Tao Hong, Soest (DE)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 14/538,954

(22) Filed: Nov. 12, 2014

(65) Prior Publication Data

US 2015/0054026 A1 Feb. 26, 2015

Related U.S. Application Data

(62) Division of application No. 13/678,186, filed on Nov. 15, 2012, now abandoned.

(51) Int. Cl.

| H01L 29/76 | (2006.01) |
| H01L 29/739 | (2006.01) |
| H01L 29/66 | (2006.01) |
| H01L 29/78 | (2006.01) |
| H01L 29/40 | (2006.01) |
| H01L 23/538 | (2006.01) |
| H01L 29/06 | (2006.01) |
| H01L 29/423 | (2006.01) |

(52) U.S. Cl.
CPC ...... *H01L 29/7397* (2013.01); *H01L 23/5386* (2013.01); *H01L 29/0696* (2013.01); *H01L 29/404* (2013.01); *H01L 29/4236* (2013.01); *H01L 29/66348* (2013.01); *H01L 29/66659* (2013.01); *H01L 29/7395* (2013.01); *H01L 29/7813* (2013.01); *H01L 2924/13055* (2013.01)

(58) Field of Classification Search
CPC ....... H01L 2924/13055; H01L 29/7813; H01L 29/7395; H01L 29/404; H01L 29/66659; H01L 29/66333; H01L 23/5386
USPC ........................................................ 257/341
See application file for complete search history.

(56) References Cited

U.S. PATENT DOCUMENTS

| 2002/0036329 A1 | 3/2002 | Dupuy et al. |
| 2004/0232484 A1 | 11/2004 | Zommer et al. |
| 2009/0014754 A1* | 1/2009 | Yoshikawa ......... H01L 29/7397 257/139 |

FOREIGN PATENT DOCUMENTS

| CN | 1333922 A | 1/2002 |
| DE | 112007000270 T5 | 12/2008 |
| DE | 102008051259 A1 | 5/2009 |

OTHER PUBLICATIONS

Gutsmann, et al., "Explanation of IGBT Tail Current Oscillations by a Novel "Plasma Extraction Transit Time" Mechanism", Proceeding of the 31st European Solid-State Device Research Conference, IEEE, Sep. 2001, pp. 255-258.

(Continued)

*Primary Examiner* — Marc Armand
*Assistant Examiner* — Tifney Skyles
(74) *Attorney, Agent, or Firm* — Murphy, Bilak & Homiller, PLLC (57) ABSTRACT

A power semiconductor device includes a power transistor including a plurality of transistor cells on a semiconductor die. At least some of the transistor cells are inhomogeneous by design so that the number of current filaments in the transistor cells with reduced local current density increases and fewer transient avalanche oscillations occur in the power transistor during operation.

7 Claims, 9 Drawing Sheets

(56) References Cited

OTHER PUBLICATIONS

Lutz, et al., "Semiconductor Power Devices: Physics, Characteristics, Reliability", Springer-Verlag, 2011, pp. 490-495.
Siemieniec, et al., "Analysis of Dynamic Impatt Oscillations Caused by Radiation Induced Deep Centres with Local and Homogenous Vertical Distribution", IEEE Proc.-Circuits Devices Syst., vol. 151, No. 3, Jun. 2004, pp. 219-224.
SZE, "Physics of Semiconductor Devices", 2nd Edition, John Wiley & Sons, 1981, pp. 566-577.

* cited by examiner

INHOMOGENEOUS POWER SEMICONDUCTOR DEVICES

TECHNICAL FIELD

The instant application relates to power semiconductor devices, and more particularly to power semiconductor devices with reduced transient avalanche oscillation.

BACKGROUND

IGBT (insulated gate bipolar transistor) chips are conventionally designed with an array of homogenous IGBT cells, so that the IGBT has a uniform characteristic. Such a homogenous design ideally results in homogeneous current distribution within the device. In reality however, a small, unintended non-homogeneity in the construction of the IGBT cells and corresponding current unbalance is unavoidable due to process variations. A slight, unavoidable non-homogeneity between and within the cells of the IGBT can lead to current filaments (spikes) during switching of the device. These current filaments can cause the local current density to exceed 10× the average current value and enhance transient avalanche dramatically, especially in IGBTs for high voltage and high current applications. Transient avalanche in IGBTs can become so strong that transient avalanche oscillation (TAO) occurs at frequencies of up to hundreds of MHz (even GHz), causing EMI disturbances.

Impact ionization can occur if the terminal voltage of a p-n diode rises above the breakdown voltage of the diode and the maximum electric field overrides the critical value. The generated electrons and holes drift through the depletion region and influence current at the terminal electrodes. The time needed by the charge generation and charge transmission through the depletion region leads to phase shift between the terminal voltage and the influenced current. The diode works as an oscillator, if the phase shift lies around 180°. If the power diode is supplied with a DC-link voltage a short time after the zero current crossing point at a low working temperature range (approximately T<280K), a dynamic IMPATT (impact ionization and transit time) oscillation can occur. This dynamic IMPATT oscillation is caused by the K-center, which is created at irradiation of the semiconductor with high energy particles and leads to temporary reduced blocking voltage.

In the turn off process of IGBTs, a portion of plasma can remain near the anode side of the device, after the IGBT has taken over the blocking voltage, the depletion region and the electrical field is built up. This residual plasma is finally removed by the tail current. The excitation mechanism based on periodic hole-current extraction from the electron-hole plasma can cause the IGBT chip to oscillate with a frequency up to several hundred MHz. Under certain conditions, random high frequency oscillations can occur during the tail phase of IGBTs which are paralleled in power modules. Such oscillations can be suppressed by suitable layout modifications to mismatch the Eigen-frequency of the module setup and the PETT (plasma transit time mechanism) frequency.

In modern IGBTs high plasma density and high storage charge are generated to enable a low forward voltage during the on-state. In the on-state, the proportionality between electron current and hole current is about 3 (i.e. the ratio of electron mobility to hole mobility). In a typical turn-off process, after the so-called Miller plateau, the IGBT is in the active state while its MOSFET part operates in the saturation region. A further drop in the gate voltage leads to further reduction of channel current (electron current). This changes the proportion between electron and hole current. At the moment of the MOS channel current turn-off, the total or a large part of the load current still flows. As such, most of the current must be carried by the holes instead of electrons. At this moment, the net hole-density near the emitter side raises according to the current share of holes as the electron-density reduces. This results in a net hole distribution (hole-density minus electron-density) near the MOS channel and allows the electrical field gradient (given by Poisson's equation) and thus the electric field to build-up near the emitter area.

An abrupt turn-off of the MOS channel current leads to a high transient electrical field peak near the emitter side, which exceeds the critical field strength of silicon and leads to avalanche. The electrons generated by the avalanche drift through the space charge area, also referred to as depletion region, to the anode side under the influence of a strong electric field. Similar to the IMPATT mechanisms previously described herein, the transit-time effect causes the IGBT chip to oscillate. Because of the remaining plasma in the drift region, Plasma Extraction Transit Time (PETT) mechanisms can also be induced and make the device more likely to oscillate.

Expansion of the space charge area during the turn-off process, coupled with the transit-time effect, disperses the corresponding frequencies from single frequencies to a continuous frequency band, depending on the actual width of the space charge area. Parasitic components in IGBT modules such as stray bond wire inductance and junction capacitance of the free wheel diode and other parasitic capacitances and inductance in the module setup can build up a resonance circuit together with the IGBT chip. If the Eigen frequencies of such resonance circuit fall into the frequency band of the transient-time effect, TAO occurs. TAO behavior appears at the moment the gate voltage falls below the threshold voltage (i.e., moment of MOS channel turn off). At this moment, the DC-link voltage is partially established and at least part of the load current still flows. In IGBT modules, TAO can be observed on the measured signal of the gate voltage due to the electromagnetic coupling and can also be detected by placing an antenna near the emitter bond wire. Under extremely high current (e.g. >2× normal current) and high voltage, TAO in IGBT modules becomes strong enough to cause EMI disturbances.

Thus, there is a need to reduce TAO in power transistors.

SUMMARY

According to the embodiments described herein, a transistor chip and design method are described which yield a self-balanced power transistor. The current distribution on the power transistor chip is homogenized by purposely introducing inhomogeneity between the cells of the power transistor and/or within the cells themselves. Purposely introducing inhomogeneity into the design of the power transistor chip increases the number of lower-magnitude current filaments during operation of the power transistor, thereby reducing the likelihood of transient avalanche and suppressing TAO.

According to an embodiment of a method of manufacturing a power semiconductor device, the method comprises: forming a power transistor comprising a plurality of transistor cells on a semiconductor die; and purposely introducing inhomogeneity into the power transistor so that the number of current filaments in the transistor cells with reduced local current density increases and fewer transient avalanche oscillations occur in the power transistor during operation.

According to another embodiment of a method of manufacturing a power semiconductor device, the method comprises: forming a power transistor comprising a plurality of transistor cells on a semiconductor die; and purposely introducing isolated current filaments in the transistor cells which cannot move to other transistor cells during operation of the power transistor.

According to yet another embodiment of a method of manufacturing a power semiconductor device, the method comprises: forming a power transistor comprising a plurality of transistor cells on a semiconductor die; and distributing current filamentation among the transistor cells so that at least some of the transistor cells have more current filaments of lower magnitude which cannot move to other transistor cells during operation of the power transistor.

According to an embodiment of a power semiconductor device, the device comprises a power transistor comprising a plurality of transistor cells on a semiconductor die. At least some of the transistor cells are inhomogeneous by design so that the number of current filaments in the transistor cells with reduced local current density increases and fewer transient avalanche oscillations occur in the power transistor during operation.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described herein provide power transistor designs with purposely different intra and/or inter-cell characteristics so that the switching characteristic of the transistor cells differs between adjacent cells and/or within the cells. The transistor cells referred to herein form the active region of the device, and are not edge cells which typically include field termination structures. As such, the transistor cells described herein collectively form the current path of the transistor device.

Inhomogeneity can be introduced into a power transistor in a known and controlled manner by intentionally varying the intra and/or inter-cell characteristics of the device. Doing so limits the number of current filaments (spikes) which participate in current commutation during the dynamic processes of the transistor to a predefined number of cells, so that the current density of the current filaments are accordingly reduced. In other words, the current becomes localized in a particular cell among a few cells and the intended current filaments in this cell are constrained to this cell so that the adjacent cells cannot take over the current filament. This way, current filaments with undefined high current densities are avoided. The electrical field distribution becomes considerably homogenized under such conditions, reducing TAO in the power transistor during operation. This same principle can be applied to the construction of the individual transistor cells.

By using an inhomogeneous cell design, a single current filament can be dispersed to a predefined number of current filaments with reduced local current density. The homogenized current distribution reduces the current density in the many filaments within the individual transistor cell and results in a reduction of TAO. Such an inhomogeneous cell has several intended current filaments. Because of the different switching behavior which results from intentionally introducing inhomogeneity, the power transistor chip can be selectively switched in a step-wise manner to suppress negative TAO effects. That is, TAO suppression is realized by implementing a chip design with controlled (known) inhomogeneity instead of uncontrolled (unknown) inhomogeneity.

Figure 1:
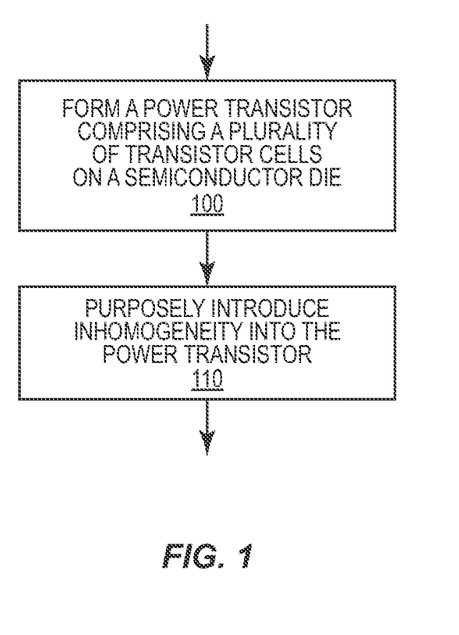
FIG. 1 illustrates a method of manufacturing a power semiconductor device with purposely introduced inhomogeneity.

FIG. 1 illustrates an embodiment of a method of manufacturing a power semiconductor device with inhomogeneity purposely introduced into the power transistor. The method comprises forming a power transistor including a plurality of transistor cells on a semiconductor die (Step 100), and purposely introducing inhomogeneity into the power transistor so that the number of current filaments in the transistor cells with reduced local current density increases and fewer transient avalanche oscillations occur in the power transistor during operation (Step 110). Intra-cell inhomogeneity can be purposely introduced into the power transistor by introducing isolated current filaments in particular ones of the transistor cells which cannot move to other transistor cells during operation of the power transistor. Inter-cell inhomogeneity can be purposely introduced by distributing current filamentation among the transistor cells so that at least some of the transistor cells have more current filaments of lower magnitude which cannot move to other transistor cells during operation of the power transistor. Purposeful intra-cell inhomogeneity results when inhomogeneity is intentionally introduced within individual ones of the transistor cells, and purposeful intra-cell inhomogeneity results when inhomogeneity is intentionally introduced between the cells. In each case, TAO is reduced and, therefore, the likelihood of the power transistor causing EMI disturbances is also reduced.

Figure 2:
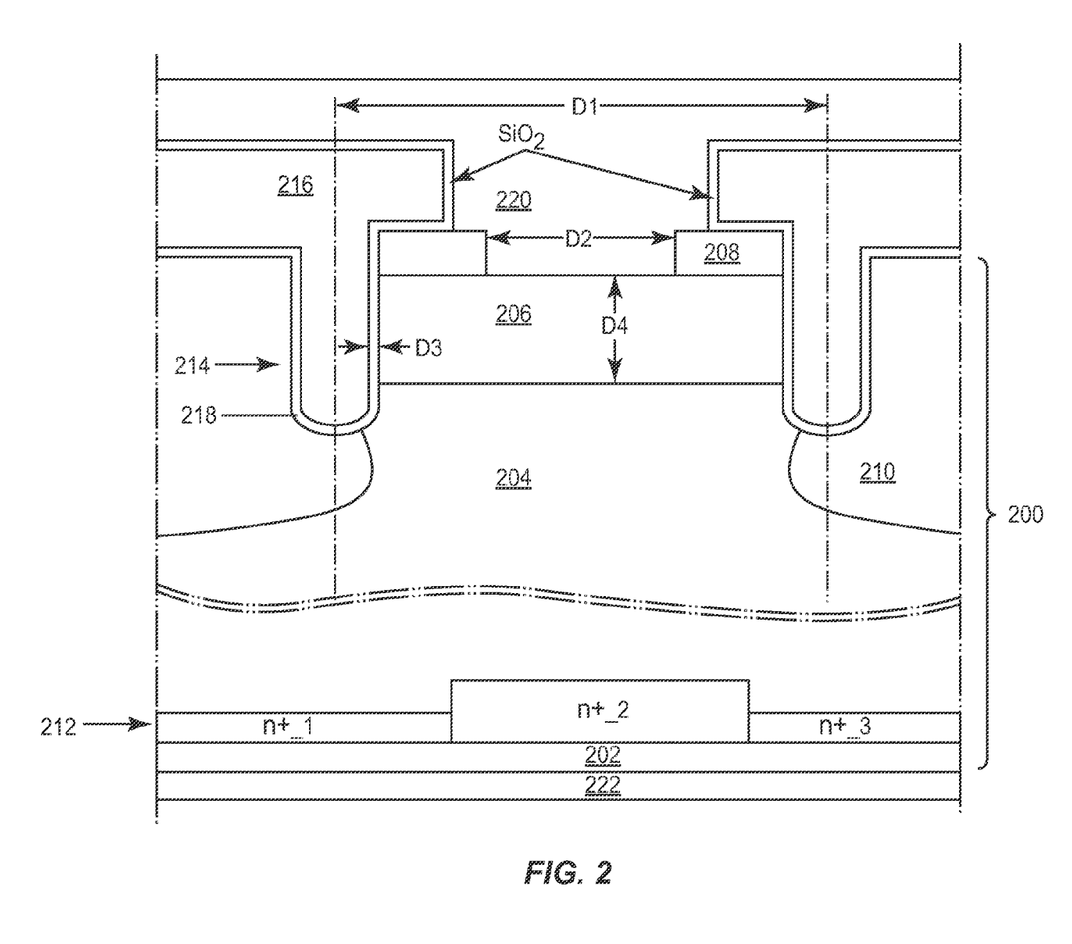
FIG. 2 illustrates a cross-sectional view of an embodiment of a power semiconductor device having several parameters, one or more of which can be adjusted to purposely introduce inhomogeneity in the device.

FIG. 2 illustrates a cross-sectional view of an exemplary IGBT cell which has various parameters (e.g. D1, D2, D3 and D4) that can be adjusted to purposely introduce intra-cell and/or inter-cell inhomogeneity. The IGBT cell in this illustration forms part of a vertical power transistor device and includes in a semiconductor body 200: a p-type collector (anode) 202; an n-type drift region 204 on the collector 202; a p-type base 206 on the drift region 204; and an n-type emitter 208 on the base 206. A p-type float region 210 can be provided for cell isolation. An optional n-type field stop zone 212 can be provided between the collector 202 and the drift region 204. The gate structure of the IGBT cell includes a trench 214 which extends into the semiconductor body 200, a gate electrode 216 disposed in the trench 214 (and optionally on the semiconductor body 200 as shown in FIG. 2) and a gate oxide 218, e.g. made of silicon oxide insulating the gate electrode 216 from the semiconductor body 200. A cathode metallization 220 contacts the emitter 208 and the base 206 through a contact opening at one side of the semiconductor body 200, and an anode metallization 222 contacts the collector 202 at the opposing side of the semiconductor body 200. The cathode and anode metallizations 220, 222 can comprise any suitable metal such as Al.

An IGBT can be constructed using an array of such cells, some or all of which can be purposely designed to introduce intra-cell and/or inter-cell inhomogeneity. The IGBT cell has various parameters (e.g. D1, D2, D3 and D4), one or more of which can be adjusted to purposely introduce inhomogeneity. For example, one or more dimensions of the field stop zone 212 can be varied for at least some of the IGBT cells. In one embodiment, the field stop zone 212 can have a thicker inner part (n+_2) and a thinner outer part (n+_1, n+_3) in the same cell.

The size (D2) of the contact opening can be adjusted for at least some of the transistor cells to purposely introduce intra-cell and/or inter-cell inhomogeneity. The thickness (D4) of the base 206 can also be varied for at least some of the transistor cells to purposely introduce inhomogeneity, as can the thickness (D3) of the gate oxide 218. Integrating cells with different gate oxide thicknesses varies the Miller capacity of the cells, causing the switching behavior between adjacent cells to differ slightly. Cells having different channel widths also can be provided by varying the trench spacing (D1) for those cells, thereby purposely introducing intra-cell and/or inter-cell inhomogeneity. The same region of different cells can have a different doping concentration to introduce inhomogeneity. For example, the doping concentration of the collector 202, drift region 204, base 206 and/or emitter 208 can be varied across cells.

Inhomogeneity can be purposely introduced between different ones of the transistor cells by the regular or irregular arrangement of various cell types. Also, the cell spacing and/or cell size can be varied for different cells. That is, one cell may have a different construction or size than another cell and may be spaced differently from an adjacent cell than other cells. For example, the cell spacing can be varied by adjusting the dimensions of the p-type floating region 210. In one embodiment, at least some of the transistor cells are surrounded by a different type of transistor cell to purposely introduce inhomogeneity between these cells.

Figure 3:
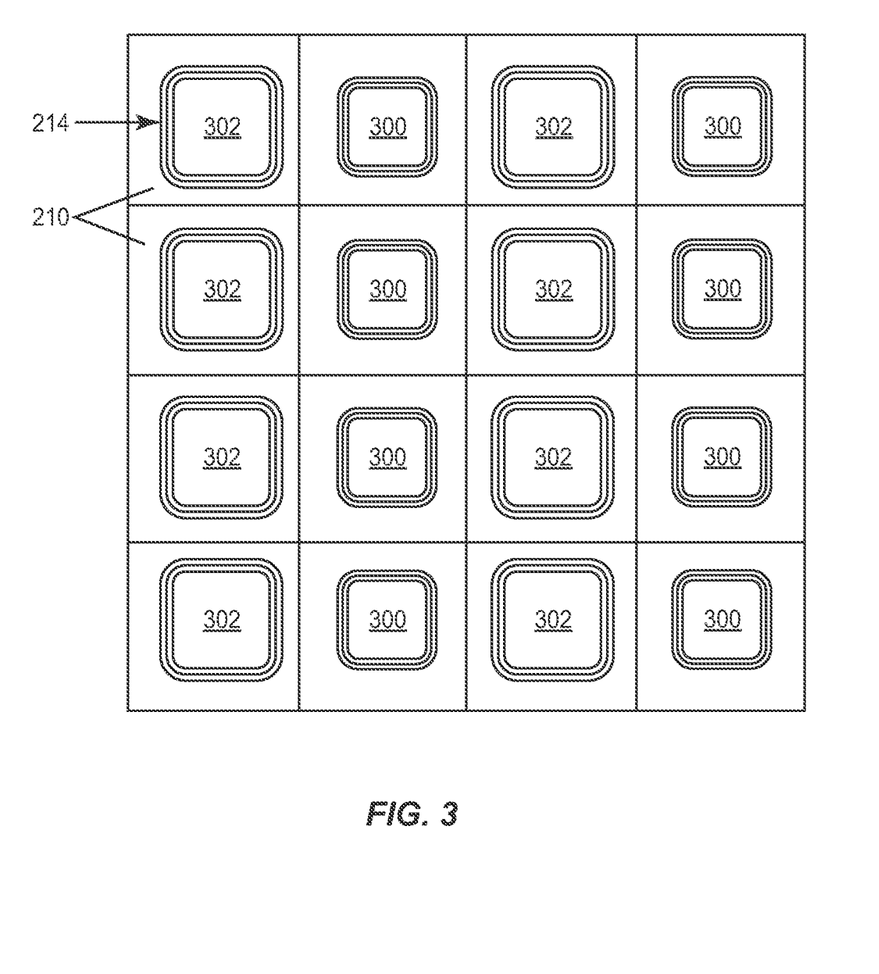
FIGS. 3 through 5 illustrate top-down plan views of power transistor cells having different characteristics which introduce inhomogeneity between the cells.

FIG. 3 illustrates a top-down plan view of a portion of the power transistor. According to this embodiment, smaller ones of the transistor cells 300 are arranged in first columns, and larger ones of the transistor cells 302 are arranged in second columns interleaved between the first columns. The larger cells 302 contribute more current than the smaller cells 300.

Figure 4:
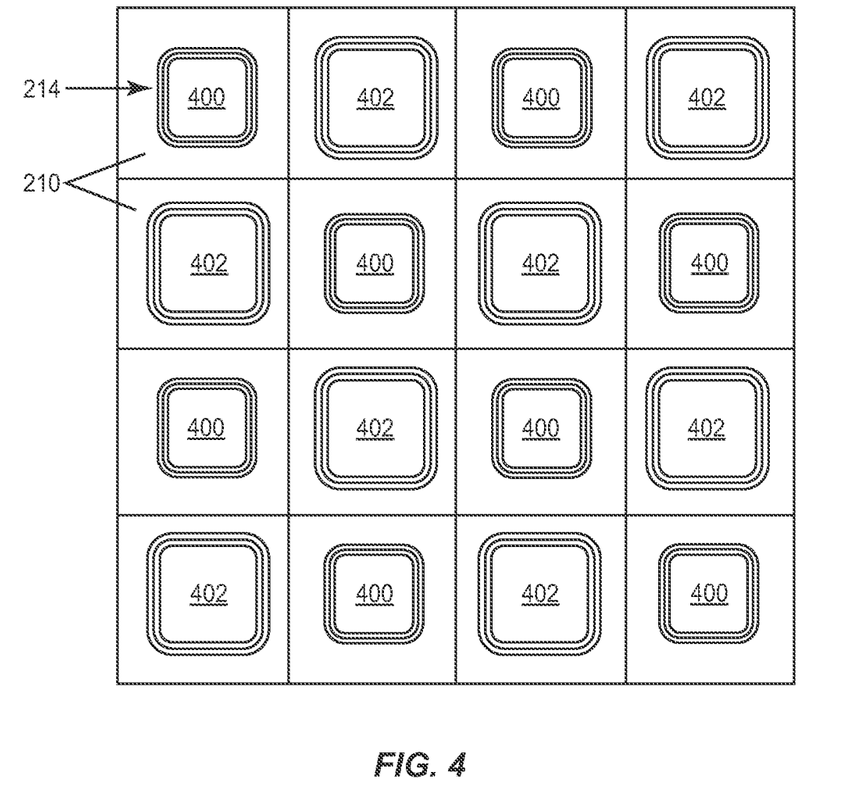

FIG. 4 illustrates a top-down plan view of a portion of the power transistor according to another embodiment. Smaller ones of the transistor cells 400 are surrounded by larger ones of the transistor cells 402, and larger ones of the transistor cells 402 are surrounded by smaller ones of the transistor cells 400 according to this embodiment.

Figure 5:
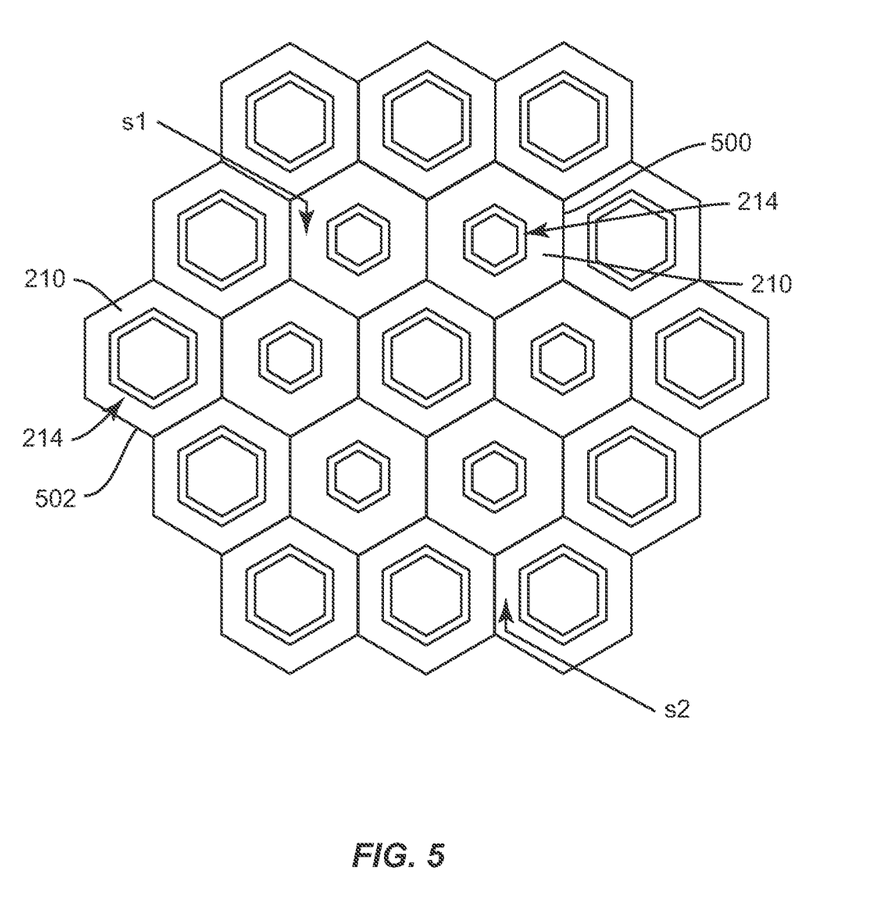

FIG. 5 illustrates a top-down plan view of a portion of the power transistor according to yet another embodiment. An arrangement of hexagonal-shaped cells 500, 502 of different sizes and spacing (s1, s2) is provided according to this embodiment to purposely introduce inhomogeneity in the power transistor. For example, the different spacing (s1, s2) can be realized by adjusting the dimensions of the p-type float region 210 between adjacent trenches 214.

In another embodiment, transistor cells with different gate channel designs can be integrated on the same semiconductor chip to purposely introduce inhomogeneity in the power transistor. For example, lateral inhomogeneity can be generated by deforming the trench gate oxide 218. Due to the resulting inhomogeneous field distribution in the channel region, during turn-off and before complete channel pinch-off, the channel current is divided into several sub-streams. The stronger current filaments are suppressed and thus reduce the likelihood of avalanche at channel pinch-off. Lower conduction losses can be achieved in the conducting state. The trench bottom can also be deformed with a wave or step so that the charge commutation from the p-float region 210 to the channel region is homogeneously and/or inhomogeneously divided. Doing so suppresses the current filament and reduces the TAO effect. The cell structure can be made relatively fine, and therefore TAO can be reduced even more.

Figure 6:
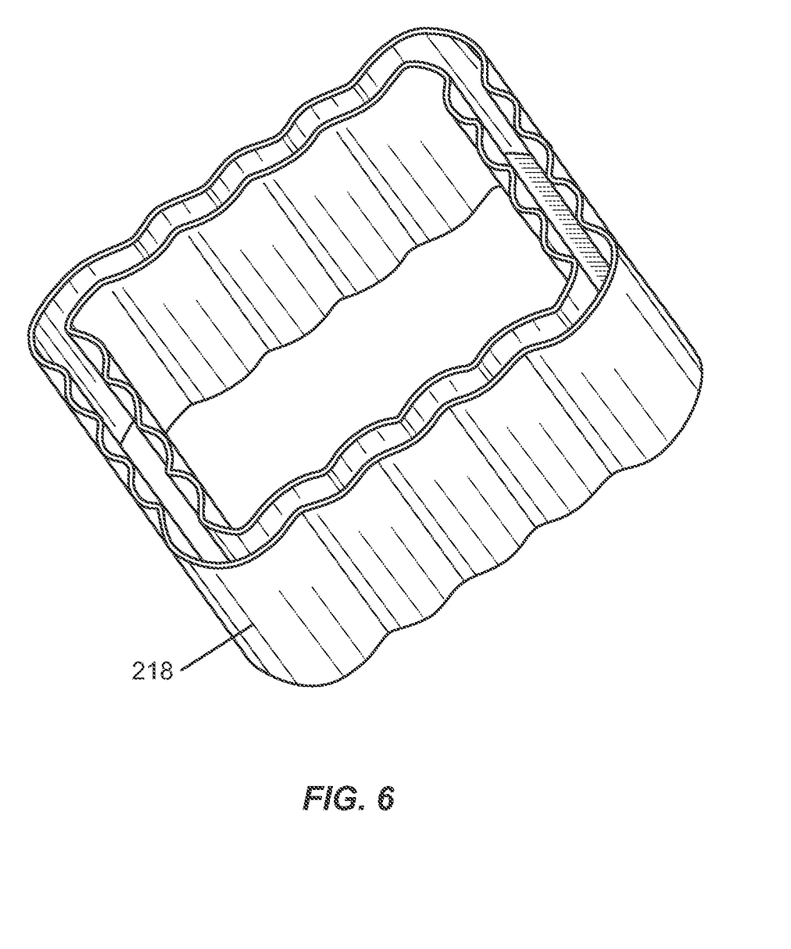
FIGS. 6 through 8 illustrate three-dimensional views of trench gate oxide structures of different constructions which introduce inhomogeneity in the cells.

FIG. 6 illustrates an embodiment of the trench gate oxide 218 for one of the cells of the power transistor. According to this embodiment, the trench gate oxide 218 is purposely designed to be wavy. The wavy structure of the trench gate oxide 218 yields an inhomogeneous field distribution in the channel region of the cell.

Figure 7:
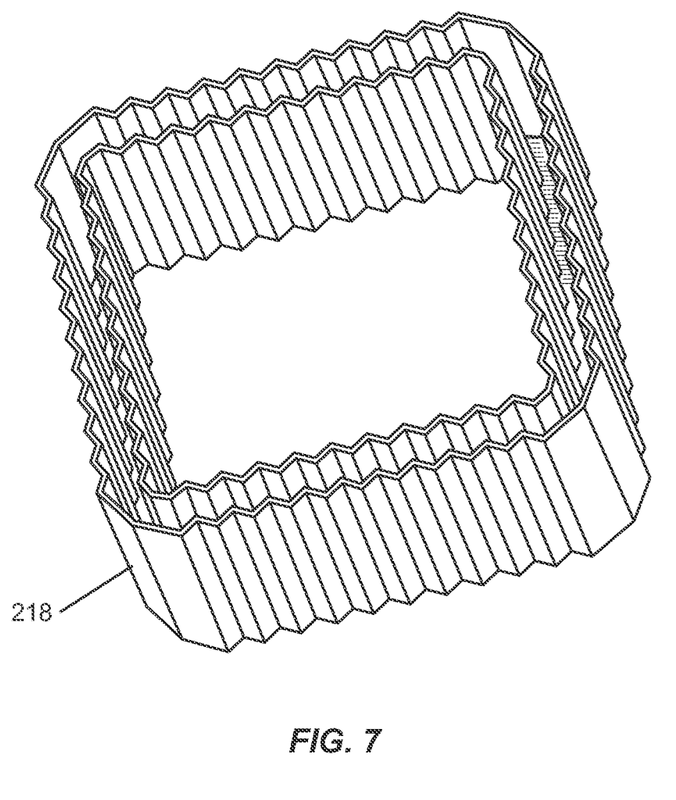

FIG. 7 illustrates another embodiment of the trench gate oxide 218 for one of the cells of the power transistor. The embodiment shown in FIG. 7 is similar to the one shown in FIG. 6, however the trench gate oxide 218 is more jagged than wavy.

Figure 8:
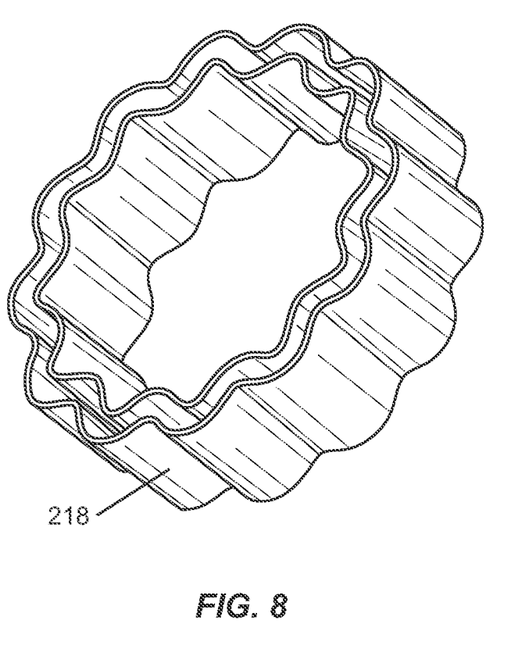

FIG. 8 illustrates yet another embodiment of the trench gate oxide 218 for one of the cells of the power transistor. According to this embodiment, the cell has a hexagonal shape and the trench gate oxide 218 is wavy. In each of the embodiments shown in FIGS. 6 through 8, the channel width is increased by using a wavy (or jagged) gate oxide 218 as compared to a conventional uniform (non-wavy) gate oxide.

Lateral Inhomogeneity can be intentionally introduced using different stripe trench gate oxide structures in the power transistor design.

Figure 9:
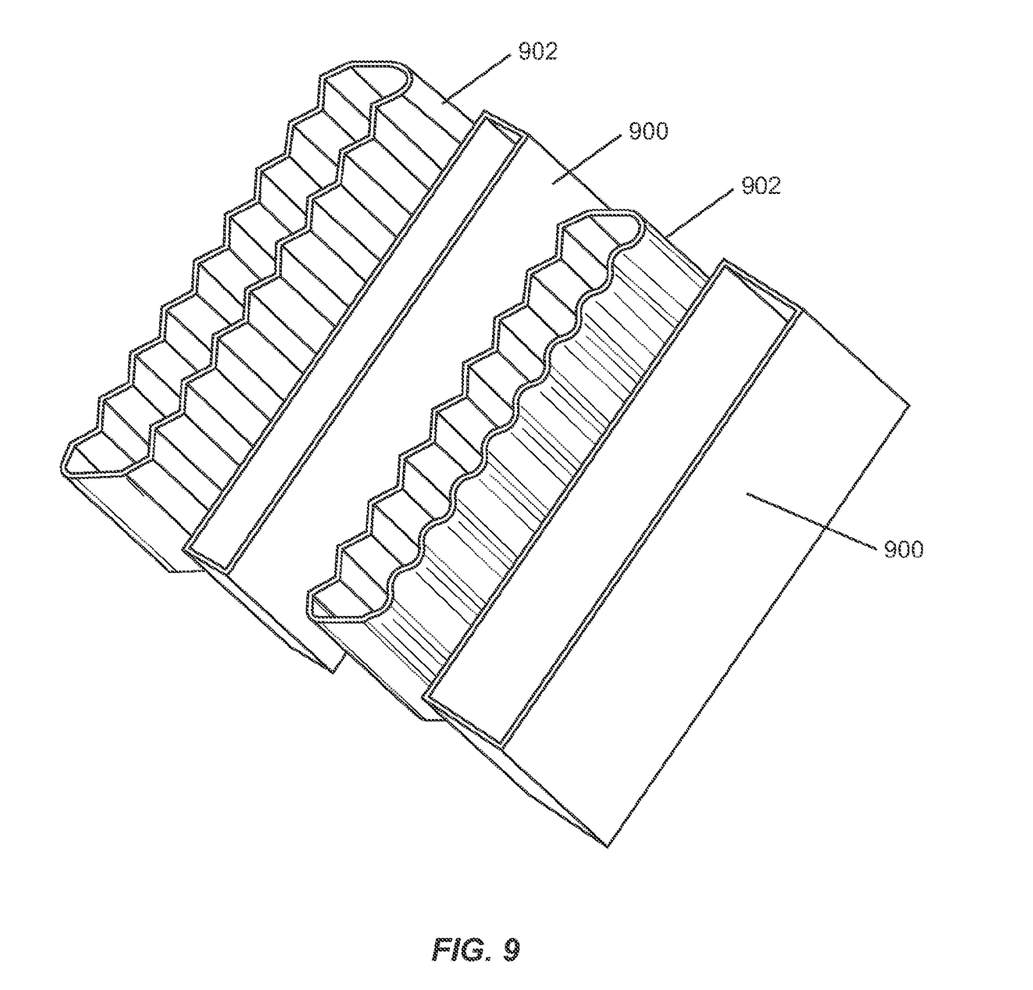
FIG. 9 illustrates a three-dimensional view of an arrangement of trench gate oxide structures with different constructions which introduce inhomogeneity in and between the cells.

FIG. 9 illustrates an embodiment of different stripe trench gate oxide structures in the same power transistor. Some of the stripe trench gate oxide structures 900 have a typical uniform, non-wavy form. Other ones of the stripe trench gate oxide structures 902 are deformed with a wavy surface as previously described herein. Implementing controlled deformation of the trench structures 902 in this way yields a channel current which is divided into several sub-streams before complete channel pinch-off. The trench bottom can also be implemented with a wavy or step form, so that the charge commutation from the p-type floating region 210 to the channel region can be homogeneously divided in order to reduce the current filament and suppress the TAO effect.

In general, any of the techniques described herein can be used in combination to yield a power transistor with controlled (known) inhomogeneity instead of uncontrolled (unknown) inhomogeneity. The different switching behavior which results from intentionally introducing inhomogeneity into the power transistor can be mitigated by selectively switching the power transistor in a step-wise manner to suppress negative TAO effects. This way, current filamentation in the power transistor can be distributed among the cells of the transistor so that at least some of the transistor cells have more current filaments of lower magnitude during operation of the power transistor. This can include purposely introducing isolated current filaments into individual ones of the transistor cells which cannot move to other cells during operation of the transistor.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a power transistor comprising a plurality of transistor cells on a semiconductor die; and
    wherein at least some of the transistor cells are inhomogeneous by design so that the number of current filaments in the transistor cells with reduced local current density increases and fewer transient avalanche oscillations occur in the power transistor during operation, and
    wherein the transistor cells comprise gate trench structures formed in a semiconductor body of the semiconductor die, each gate trench structure comprising a gate electrode in a trench formed in the semiconductor body and a gate dielectric separating the gate electrode from the surrounding semiconductor body, and wherein the gate dielectric of the inhomogeneous transistor cells is deformed by design.

2. The power semiconductor device of claim 1, wherein the inhomogeneous transistor cells comprise at least one of different cell types, different cell sizes, different channel widths, different cell spacing, and a different doping concentration for a same device region.

3. The power semiconductor device of claim 1, wherein each transistor cell comprises a collector and a field stop region of an opposite doping type as the collector adjacent the collector, and wherein one or more dimensions of the field stop region are different for the inhomogeneous transistor cells.

4. The power semiconductor device of claim 1, wherein each transistor cell comprises an emitter, a base, a contact opening, and an electrically conductive material contacting the emitter and the base through the contact opening, and wherein a size of the contact opening is different for the inhomogeneous transistor cells.

5. The power semiconductor device of claim 1, wherein each transistor cell comprises a base, and a thickness of the base differs for the inhomogeneous transistor cells.

6. The power semiconductor device of claim 1, wherein the deformed gate dielectric of the inhomogeneous transistor cells is wavy by design.

7. The power semiconductor device of claim 1, wherein the transistor cells comprise gate trench structures formed in a semiconductor body of the semiconductor die, each gate trench structure comprising a gate electrode in a trench formed in the semiconductor body and a gate dielectric separating the gate electrode from the surrounding semiconductor body, and wherein a thickness of the gate dielectric differs for the inhomogeneous transistor cells.

* * * * *